United States Patent
Chen et al.

(10) Patent No.: US 8,681,570 B2
(45) Date of Patent: Mar. 25, 2014

(54) METHODS AND SYSTEMS FOR MEMORY DEVICES WITH ASYMMETRIC SWITCHING CHARACTERISTICS

(75) Inventors: An Chen, Sunnyvale, CA (US); Zoran Krivokapic, Santa Clara, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 93 days.

(21) Appl. No.: 13/404,212

(22) Filed: Feb. 24, 2012

(65) Prior Publication Data

US 2013/0223162 A1 Aug. 29, 2013

(51) Int. Cl.
G11C 7/06 (2006.01)
G11C 7/10 (2006.01)
G11C 8/00 (2006.01)

(52) U.S. Cl.
USPC ............ 365/189.07; 365/189.05; 365/230.03

(58) Field of Classification Search
USPC ..................... 365/189.05, 189.07, 230.03
See application file for complete search history.

(56) References Cited

U.S. PATENT DOCUMENTS

| 2002/0004878 A1* | 1/2002 | Norman .................. 711/103 |
| 2004/0123202 A1* | 6/2004 | Talagala et al. ............. 714/736 |
| 2011/0113326 A1* | 5/2011 | Baer ...................... 715/255 |

* cited by examiner

*Primary Examiner* — Ly D Pham
(74) *Attorney, Agent, or Firm* — Ingrassia Fisher & Lorenz, P.C.

(57) ABSTRACT

Methods and apparatus are provided for storing data in a non-volatile memory device. A method includes comparing bits of a write instruction with bits in a memory block to determine bits to be switched in the memory block; determining a switch type for each bit to be switched in the memory block; and evaluating the switch type for each bit to be switched in the memory block. The method further comprises when at least one switch type is a first switch type, performing a first operation on the memory block, and when all of the switch types are not the first switch type, performing a second operation on each bit to be switched in the memory block.

16 Claims, 5 Drawing Sheets

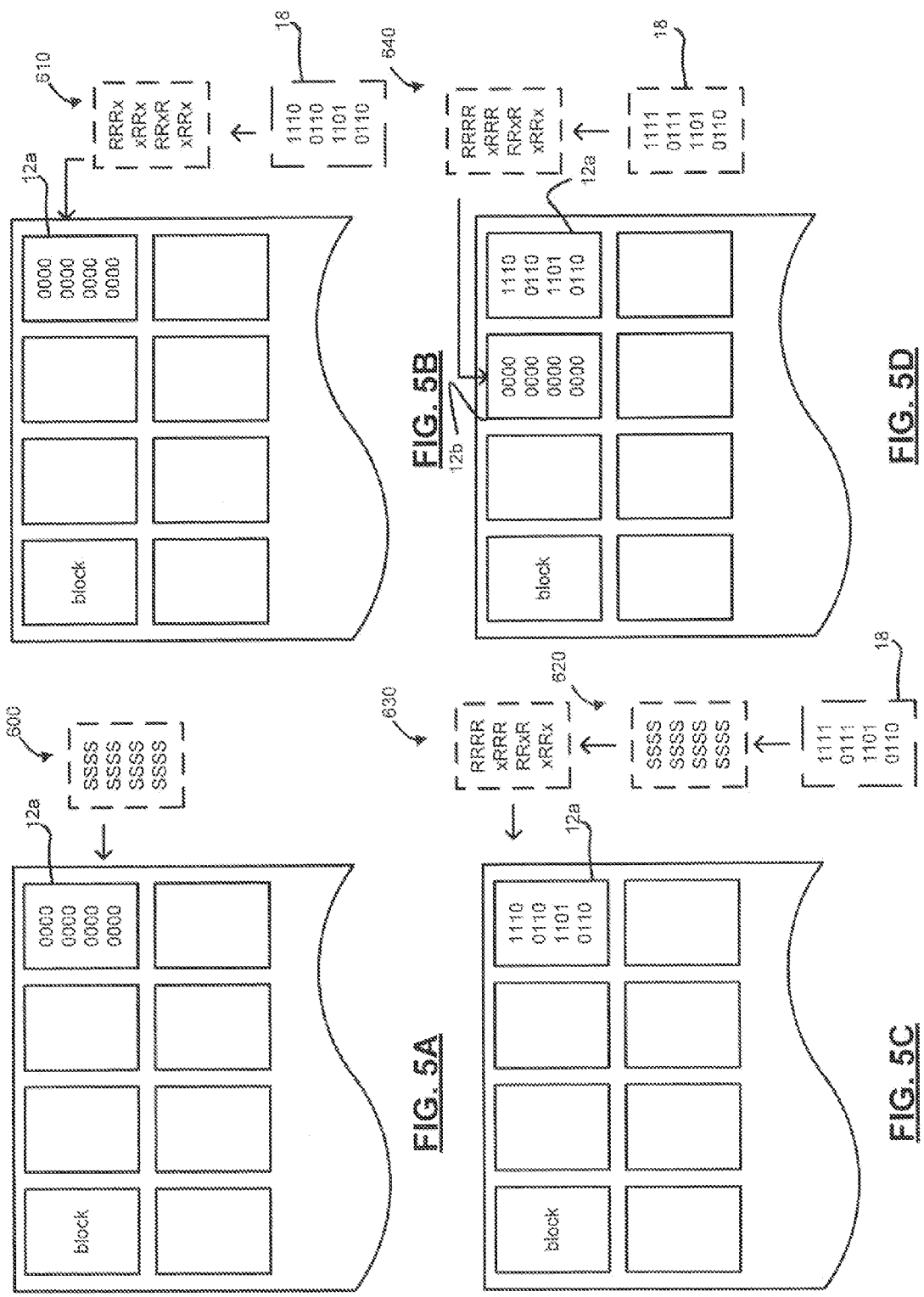

METHODS AND SYSTEMS FOR MEMORY DEVICES WITH ASYMMETRIC SWITCHING CHARACTERISTICS

FIELD OF THE INVENTION

The present invention generally relates to memory devices, and more particularly relates to methods and systems for setting and resetting data in memory devices.

BACKGROUND OF THE INVENTION

Various memory devices have asymmetric programming and erasing characteristics, that is, one of the operations either setting (programming) or resetting (erasing) performs better than the other. The better performance can include a faster speed, lower power consumption, lower current, lower voltage, higher yield, etc.

The setting and resetting operations are performed based on a change in resistance in the memory device. The performance of the change in resistance in the memory device is typically dependent upon the materials and structure of the memory device. For example, in a phase change memory device (PCM) the change in resistance is caused by a change of chalcogenide materials between crystalline and amorphous phases. The recrystallization process from amorphous phase to crystalline phase (set) is typically slower than the melting process from crystalline phase to amorphous phase (reset).

In another example, the resistance change in a spin-transfer-torque random-access-memory device (STTRAM) is the result of different orientation alignment (parallel or anti-parallel) of the magnetization direction of the top and bottom ferromagnetic electrodes. The change from parallel to anti-parallel requires higher switching current/power than that from anti-parallel to parallel. As can be appreciated various other non-volatile memory devices (e.g., resistive random-access memory devices (RRAM)) similarly display asymmetric switching characteristics.

Accordingly, it is desirable to take advantage of the operation (e.g., the reset operation or the set operation) that displays the better performance when storing data. Other desirable features and characteristics of the present invention will become apparent from the subsequent detailed description of the invention and the appended claims, taken in conjunction with the accompanying drawings and this background of the invention.

BRIEF SUMMARY OF THE INVENTION

Methods are provided for storing memory in a non-volatile memory device. In accordance with one embodiment, a method includes comparing bits of a write instruction with bits in a memory block to determine bits to be switched in the memory block; determining a switch type for each bit to be switched in the memory block; and evaluating the switch type for each bit to be switched in the memory block. The method further includes when at least one switch type is a first switch type, performing a first operation on the memory block, and when all of the switch types are not the first switch type, performing a second operation on each bit to be switched in the memory block.

Non-volatile memory devices are also provided. In accordance with one embodiment, a memory device includes a plurality of memory blocks that each includes a plurality of bits. A memory module compares bits of a write instruction with bits in a memory block to determine bits to be switched in the memory block. The memory module determines a switch type for each bit to be switched in the memory block, performs a first operation on the memory block when at least one switch type is a first switch type, and performs a second operation on each bit to be switched in the memory block when all of the switch types are not the first switch type.

BRIEF DESCRIPTION OF THE DRAWINGS

The present invention will hereinafter be described in conjunction with the following drawing figures, wherein like numerals denote like elements.

FIGS. 5A-5D are functional block diagrams illustrating data bits of the memory device according to the switching method of FIG. 4 in accordance with exemplary embodiments.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention. As used herein the term module refers to an application specific circuit (ASIC), an electronic circuit, a processor (shared, dedicated, or grouped) and memory that execute one or more software or firmware programs, a combinational logic circuit, or other suitable components that provide the described functionality.

Figure 1:
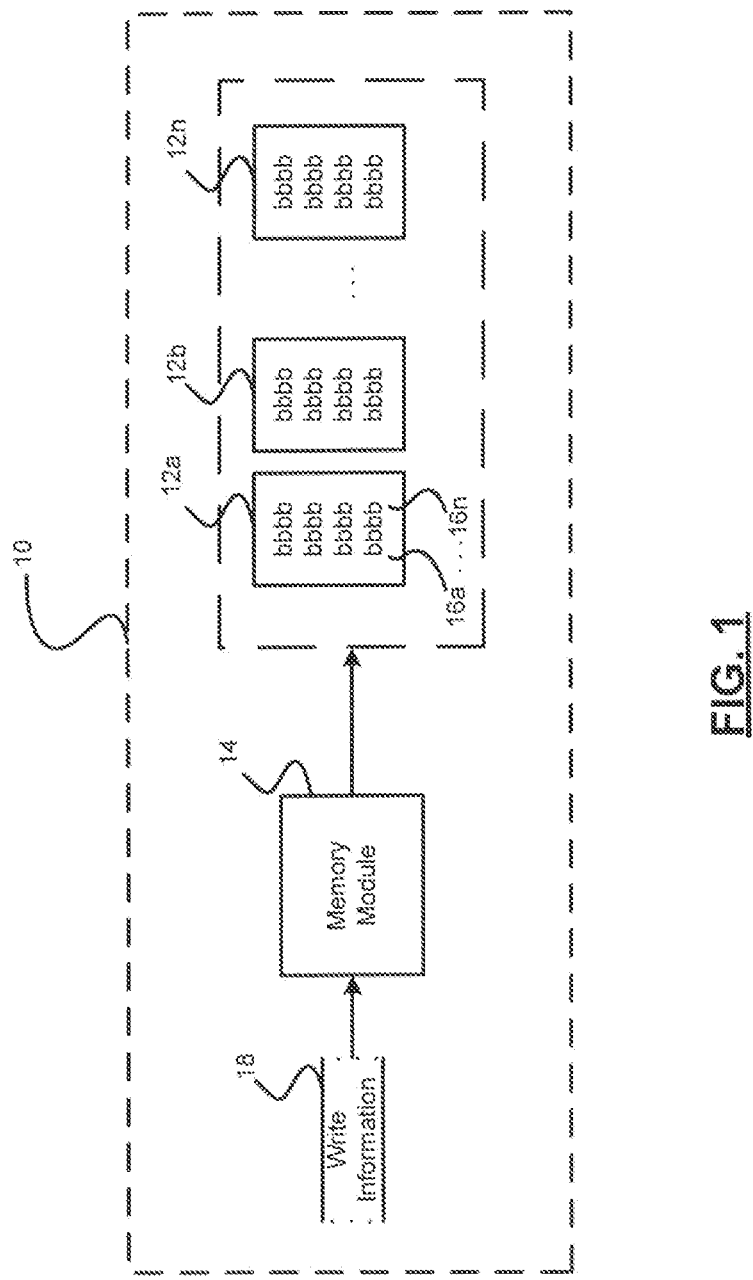
FIG. 1 is a functional block diagram illustrating a memory device in accordance with exemplary embodiments.

Referring now to FIG. 1, a memory device 10 is provided in accordance with exemplary embodiments. The memory device 10 is a non-volatile memory device, such as, but not limited to, a phase change memory device (PCM), a spin-transfer-torque random access memory device (STTRAM), a resistive random access memory device (RRAM), or other non-volatile memory device. The memory device 10 includes a plurality of memory blocks 12a-12n that are associated with one or more memory modules 14. In the examples discussed herein, the memory device 10 includes the plurality of memory blocks 12a-12n being associated with a single memory module 14. As can be appreciated, in various other embodiments (not shown), the memory blocks 12a-12n can each be associated with one or more memory modules 14, depending on the structure of the memory device 10.

Each memory block 12a-12n is associated with a plurality of bits 16a-16n. As can be appreciated, the number of bits 16a-16n in each memory block 12a-12n is dependent upon the nature of the set and reset operations.

The memory module 14 stores values (e.g., 0 or 1) in the plurality of bits 16a-16n based on write information 18 received from, for example, a write instruction. The memory module 14 stores the values by selectively performing a reset operation and a set operation on the bits 16a-16n in the memory blocks 12a-12n. In various embodiments, logic is implemented in the memory module 14 such that the reset operation and the set operation are performed on the memory blocks 12a-12n according to a switching method that takes advantage of the switching operation (e.g., the set operation or the reset operation) that displays the better performance. As discussed above, the performance of the operation is dependent upon the materials and structure of the memory device 10.

Figure 2:
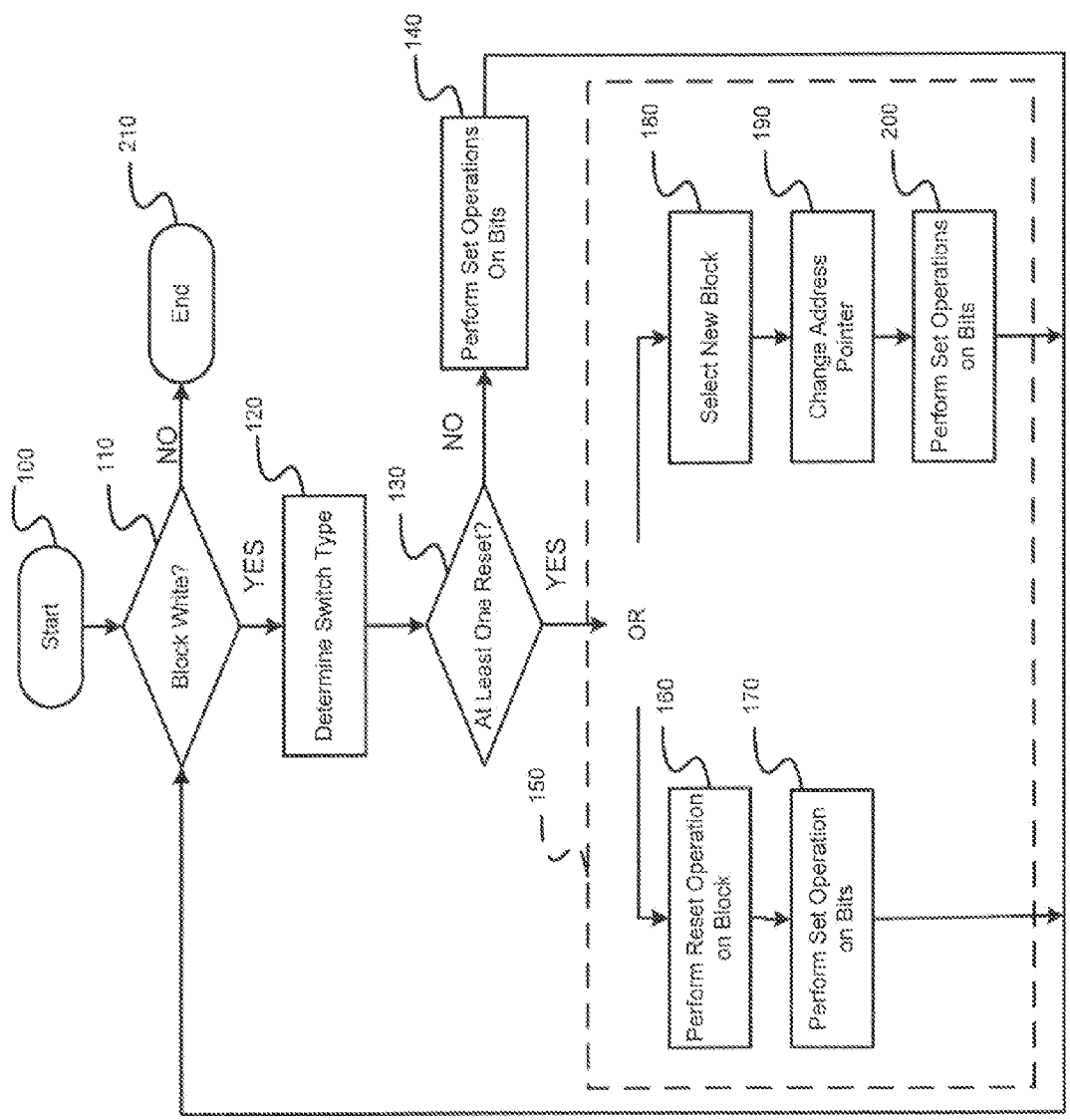
FIG. 2 is a flowchart illustrating a switching method that may be performed by the memory device of FIG. 1 in accordance with exemplary embodiments.
Figure 3:
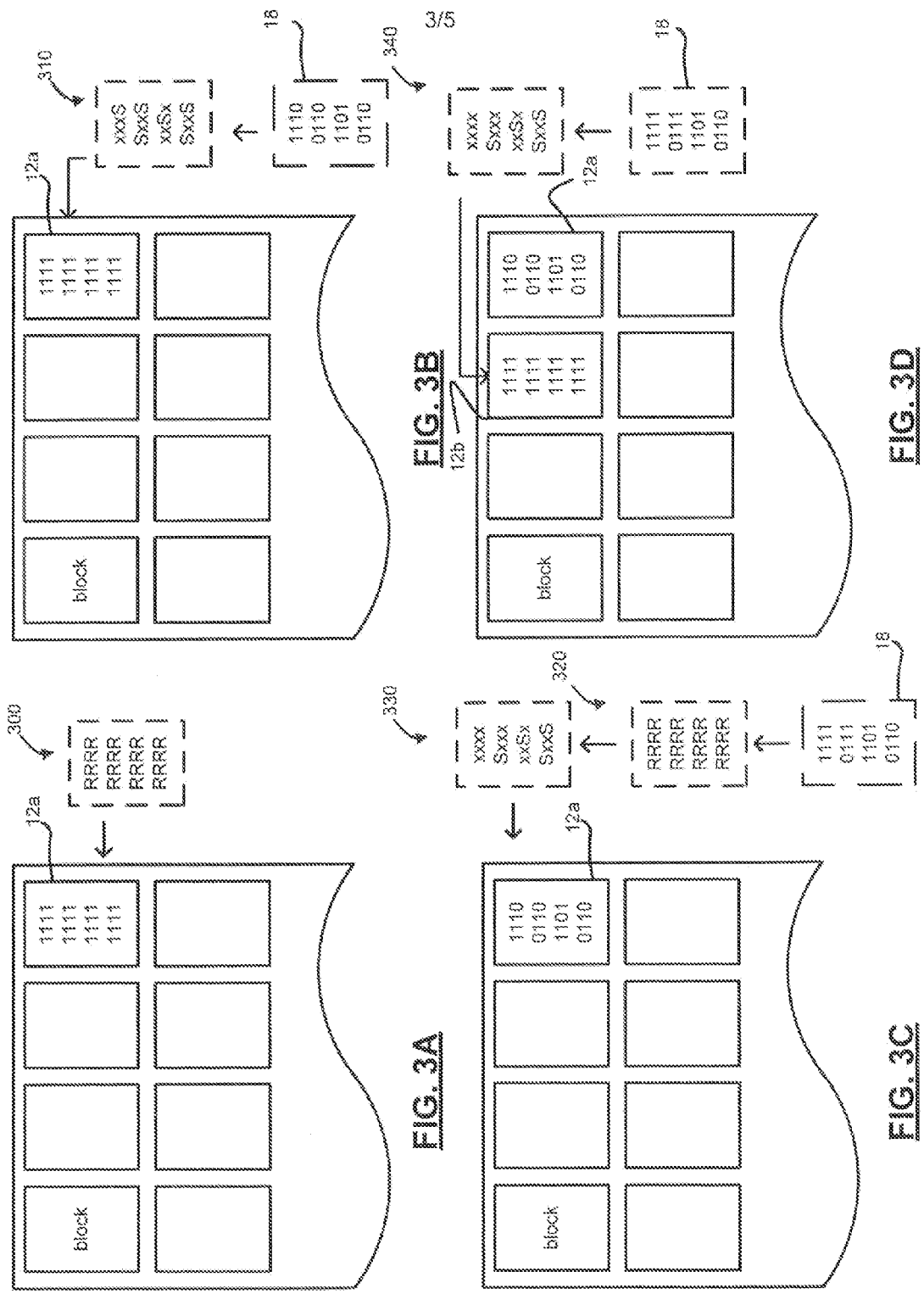
FIGS. 3A-3D are functional block diagrams illustrating switching of the data bits of the memory device according to the switching method of FIG. 2 in accordance with exemplary embodiments.

Referring now to FIG. 2 and to FIG. 3 and with continued reference to FIG. 1, a flowchart illustrates a first switching method that can be performed by the memory device of FIG. 1 in accordance with various aspects of the present disclosure. The first switching method can be performed, for example, in memory devices 10 where the performance of the set operation is better than the performance of the reset operation. In the first switching method any reset operations are performed on an entire memory block, for example memory block 12a, and any set operations are performed per bit 16a-16n of the memory block 12a, thus allowing the reset operation to be performed less frequently.

As can be appreciated in light of the disclosure, the order of operation within the method is not limited to the sequential execution as illustrated in FIG. 2, but may be performed in one or more varying orders as applicable and in accordance with the present disclosure. As can further be appreciated, one or more steps may be added or deleted from the steps illustrated in FIG. 2 without altering the spirit of the method. In various embodiments, the method may run continually during operation of the memory device 10 or be scheduled to run based on predetermined events.

In the exemplary embodiments, it is assumed that each memory block 12a-12n is initialized prior to the method, by performing a reset operation on the entire memory block 12a-12n (e.g., resetting the bits to, for example, "1" as shown at 300 of FIG. 3A).

The method may begin at 100. It is determined whether new write information is received at 110. If new write information 18 (FIG. 3) is received at 110, the memory block 12a associated with the write information 18 is evaluated to determine a switch type for each bit 16a-16n in the memory block 12a at 120. If, however, the write information 18 is not received at 110, the method ends at 210.

At 120, the switch type is determined, for example as shown at 310 of FIG. 3B, by comparing the bits of the memory block 12a with bits of the write information 18. If a bit needs to be changed from a 0 to a 1, the switch type is reset (R). If a bit needs to be changed from a 1 to a 0, the switch type is set (S).

With reference back to FIG. 2, the switch type for each bit of the memory block 12a is evaluated at 130. If the switch type is not reset (R) for any the bits at 130, the method continues at 140 where the set operation is performed on each of the bits requiring the set operation. Thereafter, the method continues with monitoring the new write information 18 at 110.

If, however, at least one switch type is reset (R), the method continues at 150 where either method steps 160-170 are performed or method steps 180-200 are performed. As can be appreciated, either one of the method steps 160-170 or the methods steps 180-200 may be performed without altering the spirit of the method. For example, at 160, the reset operation is performed on the entire memory block 12a (e.g., as shown at 320 of FIG. 3C) and, at 170, set operations are performed on the specific bits that need to be switched (e.g., as shown at 330 of FIG. 3C). Thereafter, the method continues with monitoring for new write information 18 at 110.

Alternatively, at 180, a new memory block 12b (e.g., an unused memory block) is selected from the plurality of memory blocks 12a-12n. A pointer is modified to the address of the new memory block 12b at 190. The set operation is performed on the specific bits that need to be switched at 200 (e.g., as shown at 340 of FIG. 3D). Thereafter, the method continues with monitoring for new write information 18 at 110.

Figure 4:
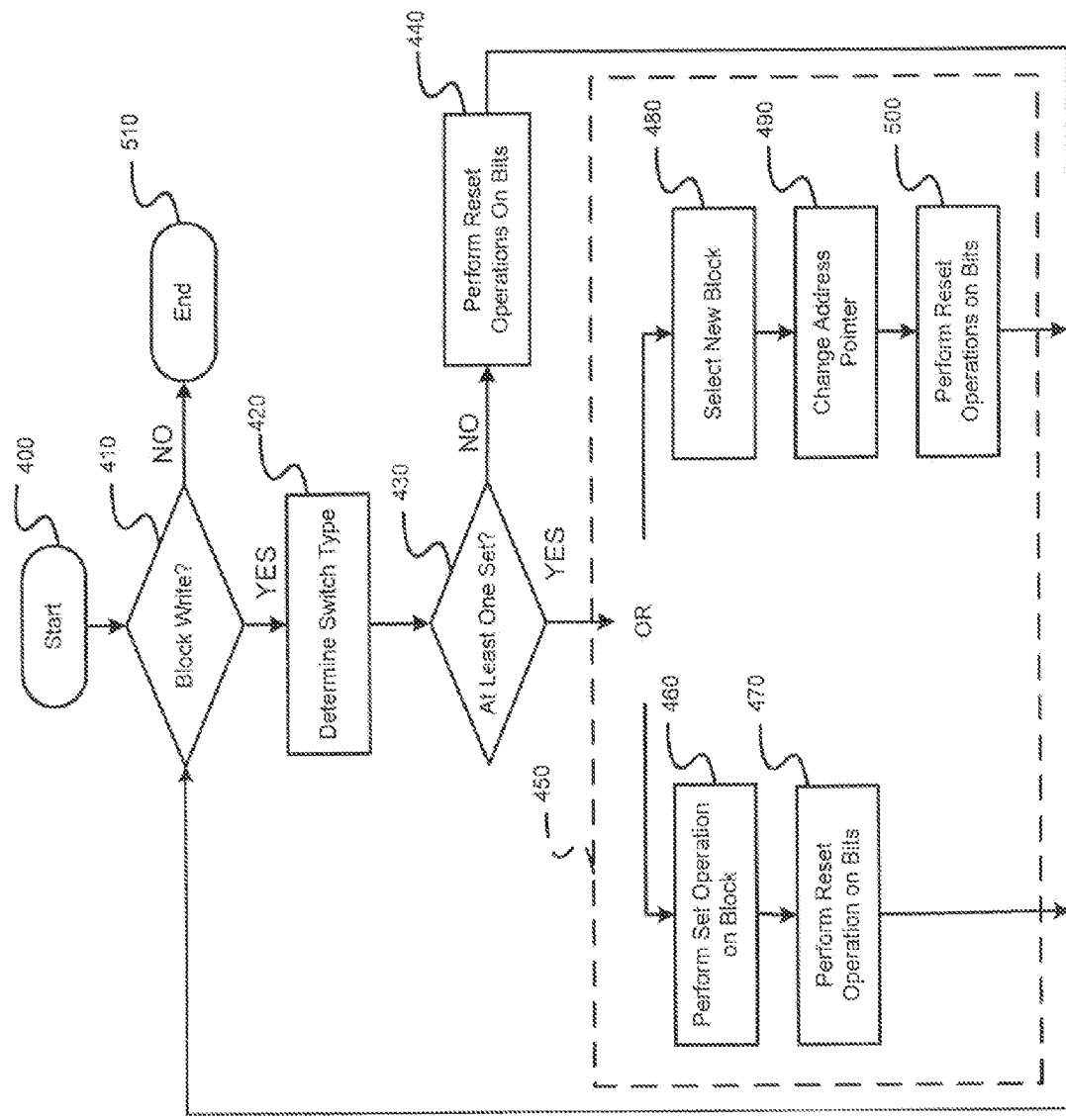
FIG. 4 is a flowchart illustrating another switching method that may be performed by the memory device of FIG. 1 in accordance with exemplary embodiments.

Referring now to FIG. 4 and FIG. 5, a flowchart illustrates a second switching method that can be performed by the memory device 10 of FIG. 1 in accordance with various aspects of the present disclosure. The second method can be performed, for example, in memory devices 10 where the performance of the reset operation is better than the performance of the set operation. In the second switching method any set operations are performed on an entire memory block 12a and any reset operations are performed per bit 16a-16n of the memory block 12a, thus allowing the set operation to be performed less frequently.

As can be appreciated in light of the disclosure, the order of operation within the method is not limited to the sequential execution as illustrated in FIG. 4, but may be performed in one or more varying orders as applicable and in accordance with the present disclosure. As can further be appreciated, one or more steps may be added or deleted from the steps illustrated in FIG. 4 without altering the spirit of the method. In various embodiments, the method may run continually during operation of the memory device 10 or be scheduled to run based on predetermined events.

In the exemplary embodiments, it is assumed that each memory block 12a-12n is initialized prior to the method, by performing a set operation on the entire memory block 12a-12n (e.g., setting the bits to, for example, "0" as shown at 600 of FIG. 5A).

The method may begin at 400. It is determined whether new write information is received at 410. If new write information 18 is received at 410, the memory block 12a associated with the write information 18 is evaluated to determine a switch type for each bit 16a-16n in the memory block 12a at 420. If, however, the write information 18 is not received at 410, the method ends at 510.

At 420, the switch type is determined, for example as shown at 610 of FIG. 5B, by comparing the bits of the memory block 12a with bits of the write information 18. Again, if a bit needs to be changed from a 0 to a 1, the switch type is reset (R); and if a bit needs to be changed from a 1 to a 0, the switch type is set (S).

With reference back to FIG. 4, the switch type for each bit of the memory block 12a is evaluated at 430. If the switch type is not set (S) for any of the bits at 430, the method continues at 440 where the set operation is performed on each of the bits requiring the set operation. Thereafter, the method continues with monitoring the new write information 18 at 410.

If, however, at least one switch type is set (S), the method continues at 450 where either method steps 460-470 are performed or method steps 480-500 are performed. As can be appreciated, either one of the method steps 460-470 or the methods steps 480-500 may be performed without altering the spirit of the method. For example, at 460 the set operation is performed on the entire memory block 12a (e.g., as shown at 620 of FIG. 5C) and, at 470, reset operations are performed on the specific bits that need to be switched (e.g., as shown at 630 of FIG. 5C). Thereafter, the method continues with monitoring for new write information 18 at 410.

Alternatively, at 480, a new memory block 12b (e.g., an unused memory block) is selected from the plurality of memory blocks 12a-12n. A pointer is modified to the address of the new memory block 12b at 490. The reset operation is performed on the specific bits that need to be switched at 500 (e.g., as shown at 640 of FIG. 5D). Thereafter, the method continues with monitoring for new write information 18 at 410.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A computer implemented method of storing data in a non-volatile memory device, comprising:
    comparing bits of a write instruction with bits in a memory block to determine bits to be switched in the memory block;
    determining a switch type for each bit to be switched in the memory block to be at least one of set and reset;
    evaluating the switch type for each bit to be switched in the memory block, and
    when at least one switch type is the reset, performing a first operation on the memory block, and
    when all of the switch types are not the first switch type, performing a second operation on each bit to be switched in the memory block.

2. The method of claim 1 wherein the performing the first operation comprises performing a reset operation.

3. The method of claim 1 wherein the when the all of the switch types are not the first switch type comprises when the all of the switch types are not the reset.

4. The method of claim 3 wherein the performing the second operation comprises performing a set operation.

5. A computer implemented method of storing data in a non-volatile memory device, comprising:
    comparing bits of a write instruction with bits in a memory block to determine bits to be switched in the memory block;
    determining a switch type for each bit to be switched in the memory block to be at least one of set and reset;
    evaluating the switch type for each bit to be switched in the memory block, and
    when at least one switch type is the set, performing a first operation on the memory block, and
    when all of the switch types are not the first switch type, performing a second operation on each bit to be switched in the memory block.

6. The method of claim 5 wherein the performing the first operation comprises performing a set operation.

7. The method of claim 5 wherein the when the all of the switch types are not the first switch type comprises when the all of the switch types are not the set.

8. The method of claim 7 wherein the performing the second operation comprises performing a reset operation.

9. A computer implemented method of storing data in a non-volatile memory device, comprising:
    comparing bits of a write instruction with bits in a memory block to determine bits to be switched in the memory block;
    determining a switch type for each bit to be switched in the memory block;
    evaluating the switch type for each bit to be switched in the memory block, and
    when at least one switch type is a first switch type, performing a first operation on the memory block,
    when all of the switch types are not the first switch type, performing a second operation on each bit to be switched in the memory block, and
    when the at least one switch type is the first switch type, selecting a new memory block and changing an address pointer to an address of the new memory block, and wherein the performing the first operation is on the new memory block.

10. The method of claim 9 wherein the when the at least one switch type is the first switch type comprises when the at least one switch type is reset.

11. The method of claim 10 wherein the performing the first operation comprises performing a set operation on each bit to be switched in the new memory block.

12. The method of claim 11 wherein the performing the second operation comprises performing a set operation on each bit to be switched in the memory block.

13. The method of claim 9 wherein the when the at least one switch type is the first switch type comprises when the at least one switch type is set.

14. The method of claim 13 wherein the performing the first operation comprises performing a reset operation on each bit to be switched in the new memory block.

15. The method of claim 14 wherein the performing the second operation comprises performing a reset operation on each bit to be switched in the memory block.

16. A non-volatile memory device, comprising:
    a plurality of memory blocks that each include a plurality of bits; and
    a memory module that compares bits of a write instruction with bits in a memory block to determine bits to be switched in the memory block, that determines a switch type for each bit to be switched in the memory block to be at least one of set and reset, that performs a first operation on the memory block when at least one switch type is at least one of set and reset, and that performs a second operation on each bit to be switched in the memory block if all of the switch types are not the first switch type.

* * * * *